United States Patent
Olmos et al.

(10) Patent No.: US 11,510,301 B2
(45) Date of Patent: Nov. 22, 2022

(54) ADAPTIVE RIPPLE IN A SOLID STATE LIGHTING DRIVER CIRCUIT

(71) Applicant: ABL IP HOLDING LLC, Atlanta, GA (US)

(72) Inventors: Eliseo Carcamo Olmos, Apodaca (MX); Gustavo Garcia Rivero, Apodaca (MX)

(73) Assignee: ABL IP HOLDING LLC, Atlanta, GA (US)

( * ) Notice: Subject to any disclaimer, the term of this patent is extended or adjusted under 35 U.S.C. 154(b) by 267 days.

(21) Appl. No.: 15/884,337

(22) Filed: Jan. 30, 2018

(65) Prior Publication Data

US 2019/0238120 A1    Aug. 1, 2019

(51) Int. Cl.

| | | |
|---|---|---|
| *H03K 3/012* | (2006.01) | |
| *H05B 45/305* | (2020.01) | |
| *H05B 47/165* | (2020.01) | |
| *H05B 45/375* | (2020.01) | |
| *H05B 45/58* | (2020.01) | |

(52) U.S. Cl.
CPC .......... *H05B 47/165* (2020.01); *H03K 3/012* (2013.01); *H05B 45/305* (2020.01); *H05B 45/375* (2020.01); *H05B 45/58* (2020.01)

(58) Field of Classification Search
None
See application file for complete search history.

(56) References Cited

U.S. PATENT DOCUMENTS

| | | | | |
|---|---|---|---|---|
| 9,974,129 | B1* | 5/2018 | Xiong | H05B 45/385 |
| 10,128,740 | B1* | 11/2018 | Xiong | H05B 47/14 |
| 2011/0199007 | A1* | 8/2011 | Yang | H05B 45/44 |
| | | | | 307/31 |
| 2015/0311808 | A1* | 10/2015 | Shteynberg | H05B 47/165 |
| | | | | 315/307 |
| 2015/0312974 | A1* | 10/2015 | Hu | H05B 33/08 |
| | | | | 315/192 |

(Continued)

OTHER PUBLICATIONS

A. E. Khateb, N. A. Rahim, J. Selvaraj and B. W. Williams, "The effect of input current ripple on the photovoltaic panel efficiency," 2013 IEEE Conference on Clean Energy and Technology (CEAT), 2013, pp. 478-481, doi: 10.1109/CEAT.2013.6775680. (Year: 2013).*

(Continued)

*Primary Examiner* — Laura Yesildag
(74) *Attorney, Agent, or Firm* — Kilpatrick Townsend & Stockton LLP

(57) ABSTRACT

A solid state driver to adapt current ripple characteristics therein, at least partially based on operating characteristics of a solid state lighting device operated by the driver, is provided. The driver senses operating voltage, operating current, or a combination of operating voltage and operating current of a solid state lighting device. The driver stores pre-determined current ripple percentage settings in a data structure, for example, in a controller circuit. The driver selects and implements one of the pre-determined current ripple percentage settings based on one or more of the sensed operating characteristics of the solid state lighting device, to improve efficiency, to reduce the operating frequency, and/or to lower the operating temperature of one or more components of the driver.

16 Claims, 9 Drawing Sheets

(56) References Cited

U.S. PATENT DOCUMENTS

| | | | | |
|---|---|---|---|---|
| 2015/0312983 A1* | 10/2015 | Hu | ........................ | H05B 45/50 |
| | | | | 315/186 |
| 2016/0036324 A1* | 2/2016 | Hofmann | ................ | H02M 1/14 |
| | | | | 315/210 |
| 2017/0093280 A1* | 3/2017 | Xiao | ..................... | H02M 3/157 |
| 2018/0248472 A1* | 8/2018 | Qiu | ................... | H05B 45/3725 |
| 2019/0036443 A1* | 1/2019 | Kim | ........................ | G06F 1/26 |
| 2019/0245454 A1* | 8/2019 | Kovatchev | ........ | H02M 3/33592 |

OTHER PUBLICATIONS

A. Elkhateb, N. A. Rahim, J. Selvaraj and B. W. Williams, "The effect of input current ripple on the photovoltaic panel efficiency," 2013 IEEE Conference on Clean Energy and Technology (CEAT), 2013, pp. 478-481, doi: 10.1109/CEAT.2013.6775680 (Year: 2013).*

Raghavan Sampath, Digital Peak Current Mode Control of Buck Converter Using MC56F8257 DSC, Freescale Semiconductor Application Note AN4716, May 29, 2013, pp. 1-22, Rev. 1, Freescale Semiconductor, Inc., Austin, Texas, United States of America.

Chuan Ni and Tateishi Tetsuo, Adaptive Constant On-Time (D-CAP™) Control Study in Notebook Applications, Texas Instruments Application Report SLVA281B, Dec. 2007, pp. 1-9, Texas Instruments, Dallas, Texas, United States of America.

Robert Sheehan, Part Two A New Way to Model Current-Mode Control, Power Electronics Technology, Jun. 2007, pp. 22-32, Power Electronics Technology.

* cited by examiner

ADAPTIVE RIPPLE IN A SOLID STATE LIGHTING DRIVER CIRCUIT

TECHNICAL FIELD

The present invention relates to lighting, and more specifically, to driver electronics for solid state light sources and devices containing the same.

BACKGROUND

Solid state light sources operate fundamentally differently than traditional light sources, and may therefore have different power supply requirements and power supply circuitry than traditional light sources. For example, while traditional light sources typically operate from, for example, a 120 V 60 Hz alternating current ("AC") power supply, a solid state light sources typically operates from a direct current ("DC") voltage level that varies based on the number and configuration of LEDs included. As an example, a solid state lighting device that includes 70 LEDs in series may be satisfactorily driven with approximately 210 V (3 V*70 LEDs), whereas a solid state lighting devices that includes 200 LEDs in series may not turn on until close to 600 V (3 V*200 LEDs) is applied.

Solid-state light source drivers can be configured to supply voltage and current to accommodate a range of input voltage levels and a range of output voltage levels to operate a solid state light source. The drivers are designed to provide flexibility to enable users to supply a wide range of input voltages and to enable users to drive solid state light sources having a wide range of output voltage demands. However, this flexibility comes at great costs in traditional drivers.

For example, traditional solid state buck converters are configured to provide a fixed current ripple percentage (of the maximum current level) while driving any one of a variety of solid state lighting devices. The fixed current ripple percentage is used to provide a stable average current. However, while providing the fixed current ripple percentage, the traditional solid state buck converter commonly exhibits flashing issues, flickering issues, high temperatures on components, electro-magnetic interference ("EMI") issues, and reduced efficiency, under dimmed and/or full load conditions. Such characteristics not only potentially reduce the life span of the solid state light sources, these issues also threaten to slow the continued expansion of solid state lighting device into the traditional lighting devices market.

SUMMARY

In embodiments, a solid state driver circuit is configured to adapt current ripple characteristics in the solid state driver, at least partially based on operating characteristics of a solid state lighting device that is operated by the solid state driver. The solid state driver senses operating voltage, operating current, or a combination of operating voltage and operating current of a solid state lighting device. The solid state driver stores pre-determined current ripple (e.g., current ripple percentage) settings in a data structure in a controller circuit for the solid state driver. The solid state driver selects and implements one of the pre-determined current ripple percentage settings based on one or more of the sensed operating characteristics of the solid state lighting device, to improve efficiency, to reduce the operating frequency, and/or to lower the operating temperature of one or more components of the solid state driver, according to various implementations.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

Figure 1:
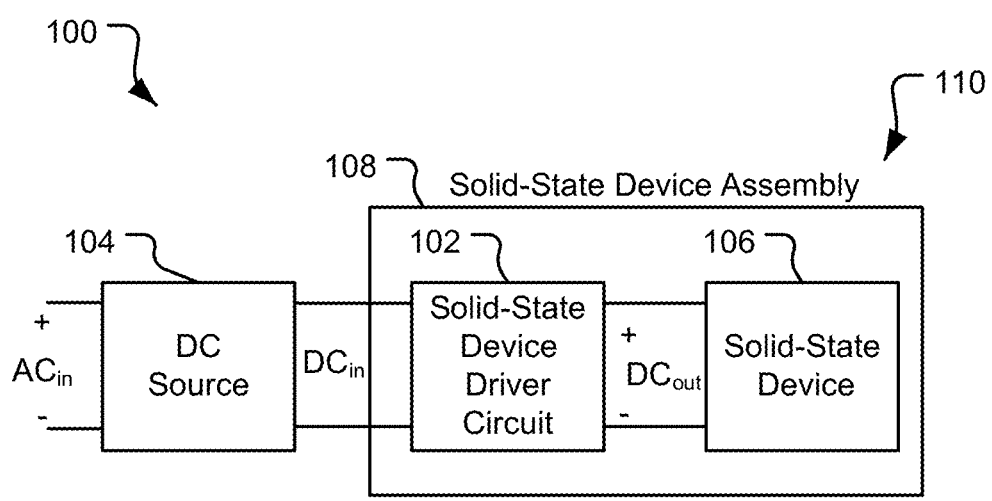
FIG. 1 is a block diagram of one exemplary embodiment of a system, according to embodiments disclosed herein.

Turning now to FIG. 1, there is provided a simplified block diagram of an embodiment of a system 100. In general, the system includes a solid state device driver circuit 102, consistent with the present disclosure, which receives a direct current ("DC") input $DC_{in}$ from a DC source 104, and provides a regulated DC output $DC_{out}$ for driving a solid state device 106. The solid state device 106 may be configured to occupy a space and include groups of LED(s) (or other solid state light sources) interconnected in series and/or parallel configurations. In some embodiments, the DC source 104 may receive and convert $AC_{in}$ from a 120 VAC/60 Hz line source. It is to be understood, however, that the DC source 104 may provide a DC input $DC_{in}$ that is in a range of voltage levels from 10-300 VDC. A system consistent with the present disclosure may operate from other DC sources, such as a 10-16 VDC source, or from other AC sources, such as a 220-240 VAC at 50-60 Hz, a 12 VAC source, etc. The solid state device driver circuit 102 and the solid state device 106 may be provided within a solid state device housing 108 of a solid state device assembly 110.

The solid state device driver circuit 102 may condition the DC input $DC_{in}$ into a DC output $DC_{out}$ that is suitable for driving or operating the solid state device 106. The solid state device driver circuit 102 may condition the DC input $DC_{in}$ into a DC output $DC_{out}$ by monitoring the operating characteristics of the solid state device 106 and by selectively adapting the output current characteristics of the solid state device driver circuit 102 to the operating conditions of the solid state device 106. For example, the solid state device driver circuit 102 may be configured to provide a particular output current ripple characteristic for an output voltage level, a range of output voltage levels, an output current level, a range of output current levels, or any combination of operating characteristics of the solid state device 106. In one implementation, the solid state device driver circuit 102 is configured to adapt the output current ripple percentage (with reference to a maximum output current level), based on the operating characteristics of the solid state device 106, to improve the efficiency, to reduce the operating frequency, and/or to lower the operating temperature of one or more components of the solid state device driver circuit 102.

Figure 2:
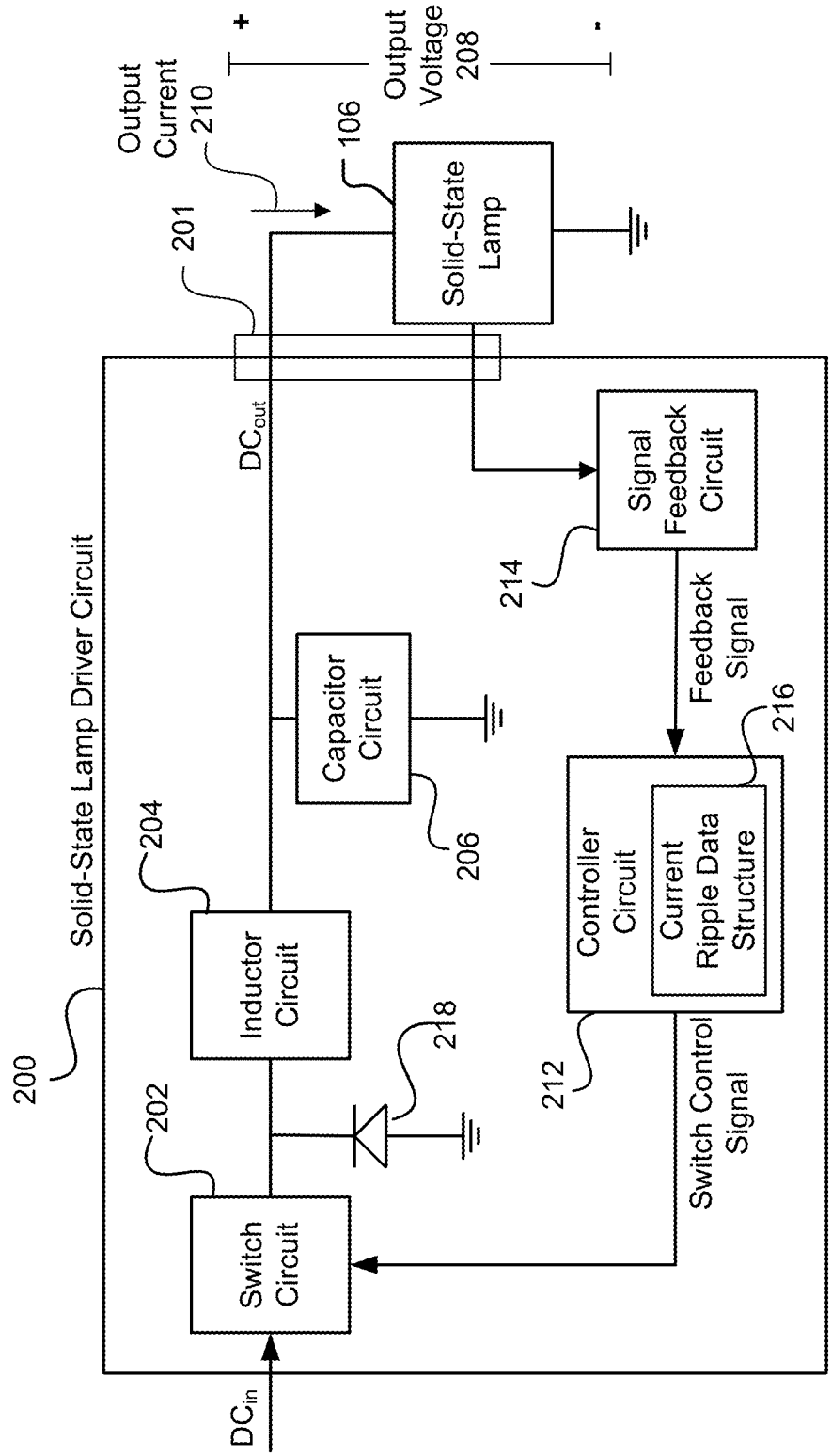
FIG. 2 is a block diagram of an embodiment of a solid state light source driver circuit coupled to a solid state lighting device, according to embodiments disclosed herein.

FIG. 2 is a block diagram that conceptually illustrates the functionality of a solid state driver circuit 200. The solid state driver circuit 200 is an example implementation of the solid state device driver circuit 102 (shown in FIG. 1). The solid state driver circuit 200 is electrically and/or mechanically coupled to the solid state device 106 through an electrical connector 201 (e.g., a light socket, an output terminal, or other electromechanical coupling). As shown, the solid state driver circuit 200, consistent with the present disclosure, may include a switch circuit 202 that selectively couples a DC input $DC_{in}$ to an inductor circuit 204 and to a capacitor circuit 206, to provide an output voltage 208 and an output current 210 (collectively, DC output $DC_{out}$) to the solid state device 106 (e.g., through the electrical connector 201).

The solid state driver circuit 200 includes and uses a controller circuit 212 and a signal feedback circuit 214 to selectively condition the DC output $DC_{out}$, to improve the performance and/or longevity of the solid state driver circuit 200 and/or to improve the performance and/or longevity of the solid state device 106. The controller circuit 212 receives, from the signal feedback circuit 214, feedback signals that are representative of the output voltage 208, of the output current 210, or of a combination of the output voltage 208 and the output current 210. The controller circuit 212 uses the feedback signal to select or identify a current ripple characteristic of the current through the inductor circuit 204 and/or the output current 210 with which to operate the solid state driver circuit 200. In one embodiment, the controller circuit 212 applies a digital representation of the feedback signal to a current ripple data structure 216 to identify a current ripple characteristic of the current through the inductor circuit 204 and/or the output current 210 with which to operate the solid state driver circuit 200, for the particular operating characteristics of the solid state device 106. The operating characteristics of the solid state device 106 include the output voltage 208 that forward biases the LEDs within the solid state device 106. The operating characteristics of the solid state device 106 also includes the output current 210 that is drawn by the LEDs within the solid state device 106 while the LEDs are forward-biased or are "on".

For a particular set of operating characteristics for the solid state device 106 (e.g., an "on" voltage of 150 V and a 0.5 A current draw), the controller circuit 212 can control a number of current ripple characteristics for the current through the inductor circuit 204 and/or for the output current 210. Some of the current ripple characteristics may include, but are not limited to, a maximum current level, a minimum current level, an average current level, and a current ripple percentage. The controller circuit 212 can control one or more of the current ripple characteristics for the current through the inductor circuit 204 and/or for the output current 210, by adjusting the period, the duty cycle, or both the period and the duty cycle by which the switch circuit 202 is operated. The current through the inductor circuit 204 and/or the output current 210 is a saw tooth waveform that oscillates between a maximum current level and a minimum current level. The maximum current level of the saw tooth waveform is established based on how long the inductor circuit 204 is permitted to charge while the switch circuit 202 is closed, to couple the DC input Din to the inductor circuit 204. The minimum current level of the saw tooth waveform is established based on how long the inductor circuit 204 is permitted to discharge into the solid state device 106 while the switch circuit 202 is open, to decouple the DC input Din from the inductor circuit 204. The amplitude of the saw tooth waveform is the difference between the maximum current level and the minimum current level. The amplitude of the saw tooth waveform is referred to as a percentage of the maximum current level of the saw tooth waveform. To illustrate with an example, if the maximum current level ("$A_{max}$") is 1.6 A and the amplitude ("$A_{amplitude}$") of the saw tooth waveform is 0.7 A, then the current ripple percentage for this example is ($A_{amplitude}/A_{max}$=0.7 A/1.6 A=) 43.8%, and the average current level is ($A_{max}-(0.5*A_{amplitude})$=1.6 A−(0.5*0.7 A)=) 1.25 A. The maximum current level of the current ripple of the current through the inductor circuit 204 and/or the output current 210 is increased when the time period for operating the switch circuit 202 is lengthened (i.e., the frequency of switching is decreased). The maximum current level of the current ripple of the current through the inductor circuit 204 and/or the output current 210 is decreased when the time period for operating the switch circuit 202 is shortened (i.e., the frequency of switching is increased). Similarly, the minimum current level of the current ripple of the current through the inductor circuit 204 and/or the output current 210 is decreased when the time period for operating the switch circuit 202 is lengthened (i.e., the frequency of switching is decreased). The minimum current level of the current ripple of the current through the inductor circuit 204 and/or the output current 210 is increased when the time period for operating the switch circuit 202 is shortened (i.e., the frequency of switching is increased).

Traditional solid state driver circuits are configured to maintain a fixed current ripple percentage (e.g., 25%), regardless of the operating characteristics of the solid state lighting device loads to which they are connected. As result, traditional solid state driver circuits operate at as high a frequency as needed to achieve the programmed current ripple percentage. Examples of operating frequencies of traditional solid state driver circuits for a 100 W solid state lighting device are in the range of 200 kHz. At these frequencies, components of the traditional solid state driver circuits, such as switches and/or inductors, regularly reach temperatures that exceed 100° C. Such high frequency and high temperature operation reduce the lifespan of the components of the traditional solid state driver circuits and similarly influenced the longevity of the solid state light devices that the traditional solid state driver circuits operate.

Consistent with the present disclosure, the controller circuit 212 adapts the frequency and duty cycle of the switch control signal that operates the switch circuit 202, to obtain a predetermined current ripple characteristic for a particular set of operating characteristics for the solid state device 106. In other words, the controller circuit 212 receives a feedback signal that is representative of the output voltage 208, of the output current 210, or of a combination of the output voltage 208 and the output current 210, and the controller circuit 212 adapts a current ripple characteristic (from a number of predetermined current ripple characteristics) for the current through the inductor circuit 204 and/or the output current 210, to operate the solid state driver circuit 200 under conditions that improve the efficiency and that reduce the temperatures by which the components operate.

In one implementation, the controller circuit 212 selects a current ripple percentage, from a number of predetermined current ripple percentages, based on the output voltage 208 that is sensed through the signal feedback circuit 214. The predetermined current ripple percentages and their corresponding output voltage levels are stored in a current ripple data structure 216, within the controller circuit 212, according to one embodiment. The current ripple data structure 216 may be implemented as a table, an array, or some other data structure within a memory of the controller circuit 212. An illustrative and non-limiting example of potential contents of the output voltage ranges with additional specific values for current ripple percentages is provided in Table 1 below.

TABLE 1

| Sensed Output Voltage (range) | Current Ripple Percentage |
|---|---|
| 40 V | 30% |
| 48 V | 30% |
| 56 V | 32% |
| 64 V | 34% |
| 72 V | 38% |
| 80 V | 43% |
| 88 V | 43% |
| 96 V | 43% |
| 104 V | 43% |
| 112 V | 43% |
| 120 V | 43% |
| 128 V | 43% |
| 136 V | 41% |
| 144 V | 39% |
| 152 V | 37% |
| 160 V | 33% |
| 168 V | 29% |
| 176 V | 25% |
| 184 V | 24% |
| 192 V | 18% |

In one implementation, the controller circuit 212 selects a current ripple percentage, from a number of predetermined current ripple percentages, based on the output current 210 that is sensed through the signal feedback circuit 214. The predetermined current ripple percentages and their corresponding output current levels are stored in the current ripple data structure 216, within the controller circuit 212, according to one embodiment. An illustrative and non-limiting example of potential contents of the current ripple data structure 216 is provided in Table 2 below.

TABLE 2

| Sensed Output Current (range) | Current Ripple Percentage |
|---|---|
| Less than 0.5 A | 42% |
| 0.5-0.6 A | 42% |
| 0.6-0.7 A | 40% |
| 0.7-0.8 A | 39% |
| 0.8-0.9 A | 38% |
| 0.9-1.3 A | 37-33% |
| 1.3-1.4 A | 32% |

TABLE 2-continued

| Sensed Output Current (range) | Current Ripple Percentage |
|---|---|
| 1.4-1.5 A | 31% |
| 1.5-1.6 A | 30% |
| Greater than 1.6 | 30% |

Table 2 corresponds to one or more current ripple percentages with each output current level or with each range of output current levels, that may be used by the controller circuit 212 to adapt the current ripple characteristics of the solid state driver circuit, based on operating characteristics of the solid state device 106. The output voltage levels and the current ripple percentages illustrated in Table 2 are provided as illustrative examples, however, in practice, Table 2 and the current ripple data structure 216 may include tens, hundreds, or thousands of rows that correlate specific output current levels or output current ranges with additional specific values for current ripple percentages.

In one implementation, the controller circuit 212 selects a current ripple percentage, from a number of predetermined current ripple percentages, based on a combination of the output voltage 208 and the output current 210 that are sensed through the signal feedback circuit 214. For example, the controller circuit 212 may identify a first current ripple percentage based on the output voltage 208, may identify a second current ripple percentage based on the output current 210, and may combine the first current ripple percentage and the second current ripple percentage by taking the average of the first and second current ripple percentages, according to one implementation.

The various components of the solid state driver circuit 200 may include one or more discrete components or networks of components, consistent with the present disclosure. The switch circuit 202 may be a single transistor (e.g., a power MOSFET) or may be a number of transistors configured in parallel and/or series to achieve operating characteristics sufficient to operate as a buck converter switch. The inductor circuit 204 may be a single inductor component or maybe a number of inductors configured in parallel and/or series to achieve a particular inductance for the solid state driver circuit 200. The capacitor circuit 206 may be a single capacitor component or may be a number of capacitors configured in parallel and/or series to achieve a particular capacitance for the solid state driver circuit 200. The controller circuit 212 may be a microcontroller (e.g., the ATSAMD21E16L manufactured by Microchip) having one or more processors, nonvolatile memory, and volatile memory, to store instructions used for operating the switch circuit 202. The signal feedback circuit 214 may be implemented with one or more low-resistance (e.g., less than 10 ohms) resistors to enable the controller circuit 212 to sense a predetermined fraction of the output voltage 208 and/or to enable the controller circuit 212 to determine the output current 210 based on a voltage that is induced across the resistor. The diode 218 includes one or more discrete diode components configured to supply current from ground through the inductor circuit 204 while the switch circuit 202 is in an open configuration, during the operation of the solid state driver circuit 200. The components of the solid state driver circuit 200 are arranged in a DC-to-DC buck converter configuration, according to one implementation.

Figure 3:
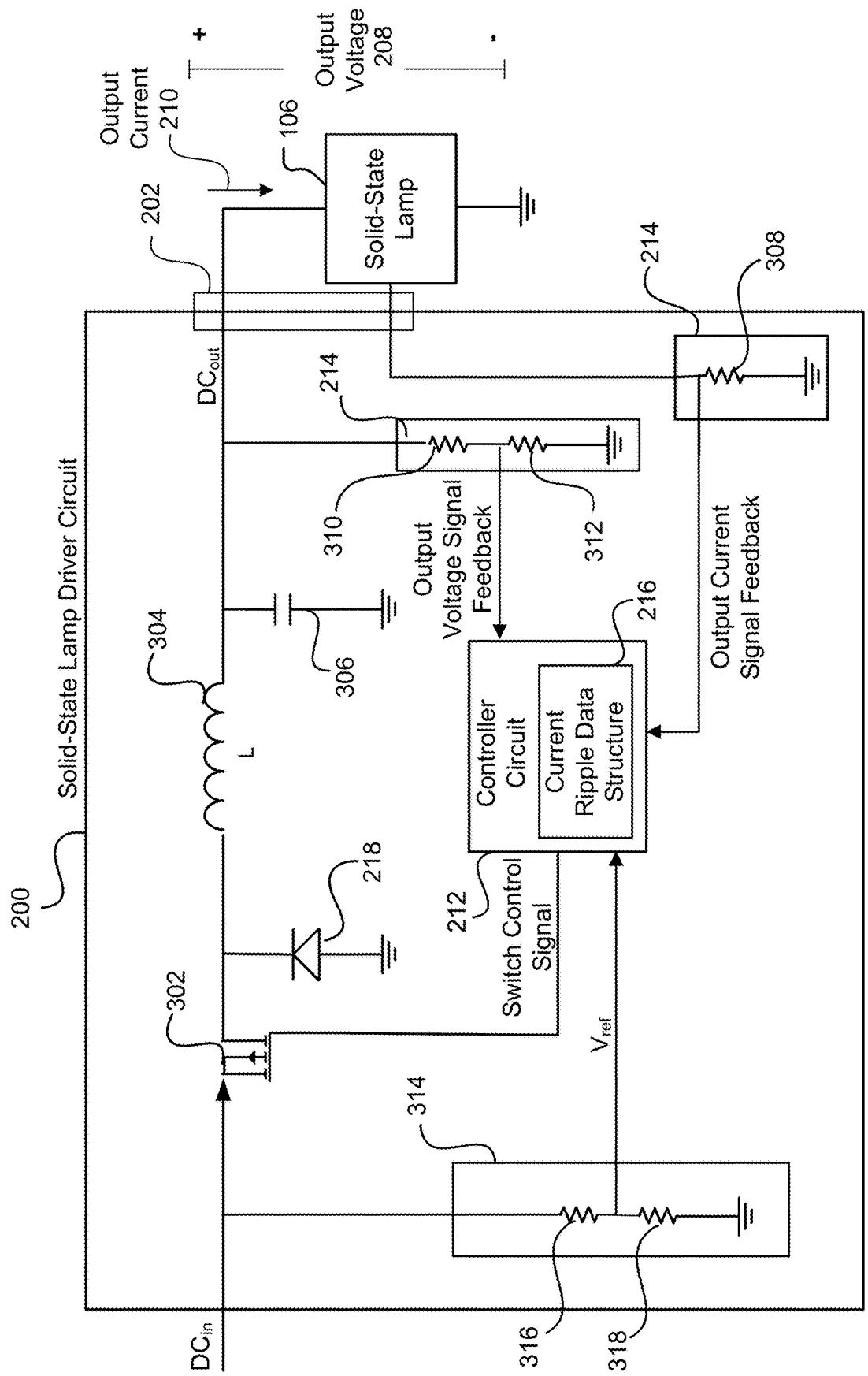
FIG. 3 is a circuit diagram of an embodiment of a solid state driver circuit, according to embodiments disclosed herein.

FIG. 3 is a circuit diagram that conceptually illustrates example components of the solid state driver circuit 200 consistent with the present disclosure. The solid state driver circuit 200 includes a P-channel MOSFET 302 as an example implementation of the switch circuit 202. The P-channel MOSFET 302 may be replaced with an NPN BJT, a PNP BJP, or an N-channel MOSFET, according to various implementations. The solid state driver circuit 200 includes an inductor 304 as an example implementation of the inductor circuit 204. The solid state driver circuit 200 includes a capacitor 306 as an example implementation of the capacitor circuit 206. The solid state driver circuit 200 includes a resistor 308 coupled between the solid state device 106 and a voltage reference (e.g., ground) to sense an output current signal feedback, as an example implementation of part of the signal feedback circuit 214. The solid state driver circuit 200 includes a resistor 310 and a resistor 312 configured as voltage divider and coupled between the DC output $DC_{out}$ and a voltage reference (e.g., ground) to sense an output voltage signal feedback, as an example implementation of part of the signal feedback circuit 214. The solid state driver circuit 200 includes a voltage divider 314 coupled between a voltage reference (e.g., ground) and the DC input $DC_{in}$. The voltage divider 314 includes a resistor 316 and a resistor 318 for determining a reference voltage $V_{ref}$ that is provided to the controller circuit 212.

Figure 4:
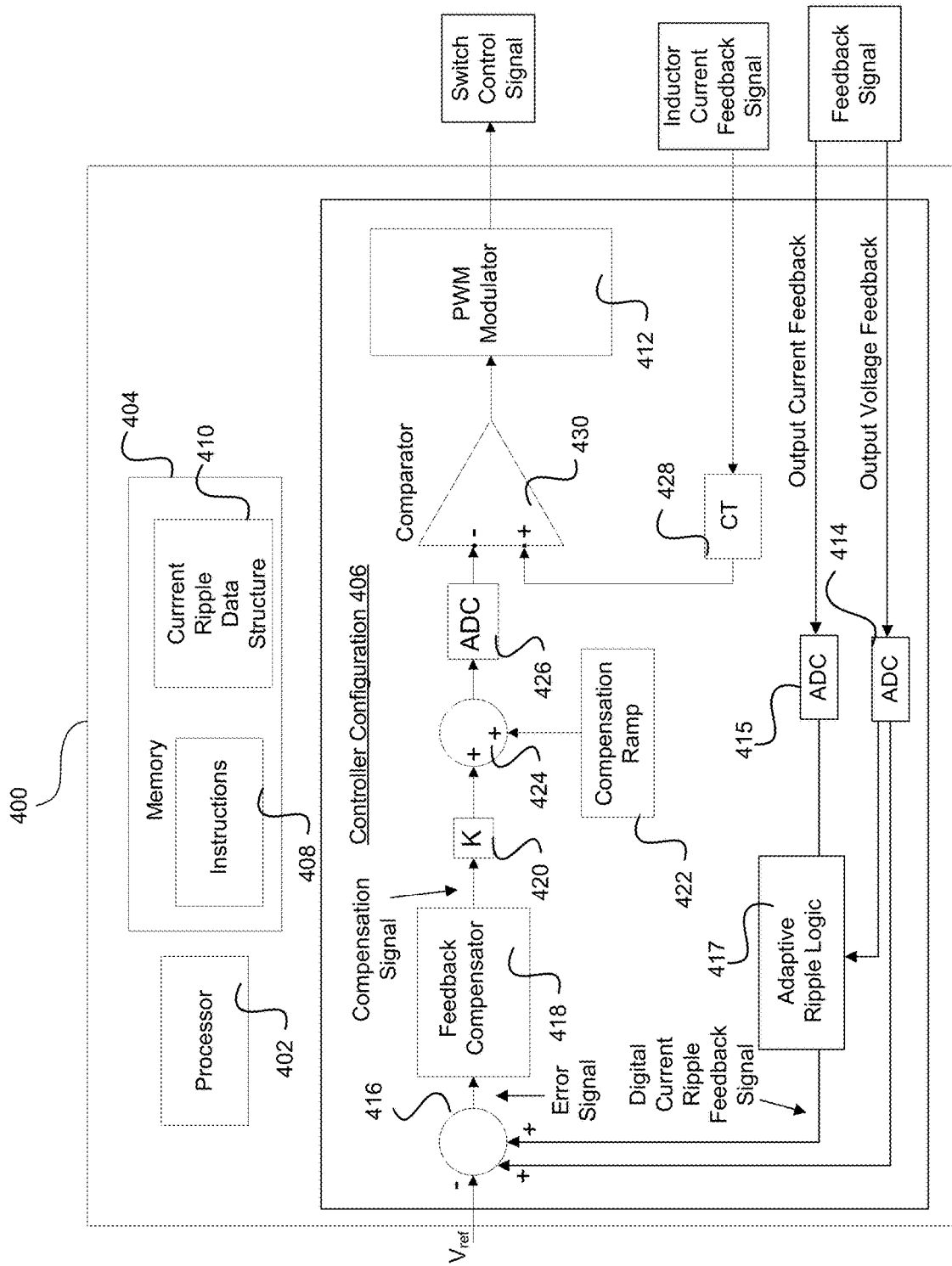
FIG. 4 is a block diagram of an embodiment of a controller circuit of a solid state driver circuit, according to embodiments disclosed herein.

FIG. 4 is a block diagram that conceptually illustrates an example implementation of portions of a controller circuit 400 that is representative of an implementation of the controller circuit 212 (shown in FIGS. 2 and 3) consistent with the present disclosure. The controller circuit 400 includes a processor 402 and memory 404 to implement a controller configuration 406 that adapts current ripple characteristics of a solid state driver circuit, at least partially based on operating characteristics of a solid state lighting device that is driven by the solid state driver circuit. The operating characteristics of the solid state lighting device are represented by an output current feedback signal and an output voltage feedback signal. The controller circuit 400 uses the processor 402 to execute instructions 408 and to reference a current ripple data structure 410 to set up and execute the controller configuration 406 to adapt current ripple characteristics to operating characteristics of a solid state lighting device.

The controller configuration 406 provides the switch control signal with a pulse width ("PWM") modulator 412. The controller configuration 406 converts feedback signals for output voltage feedback into a digital signal with an analog to digital converter ("ADC") 414. The controller configuration 406 converts feedback signals for output current feedback into digital signal with an ADC 415. The digital representation of the output voltage feedback and of the output current feedback are provided to adaptive ripple logic 417, which converts the output voltage feedback and the output current feedback into a digital current ripple feedback signal. The controller configuration 406 determines an error between the output voltage feedback signal, the digital current ripple feedback signal, and a reference voltage $V_{ref}$ (representative of the DC input) by subtracting the reference voltage $V_{ref}$ from the sum of the output voltage feedback signal and the digital current ripple feedback signal, with a sum operator 416. The error signal is provided to a feedback compensator 418, which may include a transfer function having one or more poles and zeros. In one implementation, the feedback compensator 418 is a 2 pole-2 zero transfer function, although, other pole-zero configurations may be implemented. The compensation signal is amplified by a gain stage 420 and the amplified compensation signal is combined with a compensation ramp 422 at a sum operation 424. The combination of the amplified compensation signal and the compensation ramp 422 are converted with an ADC 426 for comparison, with comparator 430, to an inductor current feedback signal applied to a timing capacitor ("CT") 428. The output of the comparator 430 is provided to the PWM modulator 412 to repeatedly update the switch control signal that is used to operate the switch circuit of the buck converter configuration.

In one embodiment, the instructions 408 and/or the adaptive ripple logic 417 include one or more formulas for setting the current ripple percentage, in addition to or instead of using a data structure (similar to Table 1 or Table 2). The formula or equation may include:

NewRippleSetting[x]=L×(2×Ripple_I[x]), where
x=Voutput on load where
Ripple_I[x]=RippleMin+offset[Voutput1]+ . . . +
offset[VoutputN]

In one embodiment RippleMin is set to 16% as a minimum current ripple percentage and each offset is additional quantities of percentage to add to the current ripple percentage, as compared to the existing current ripple percentage. In one embodiment, the offset values may be negative, so that the controller circuit 400 may selectively decrease the current ripple percentage based on the operating characteristics of the solid state lighting device (e.g., the load).

Figure 5:
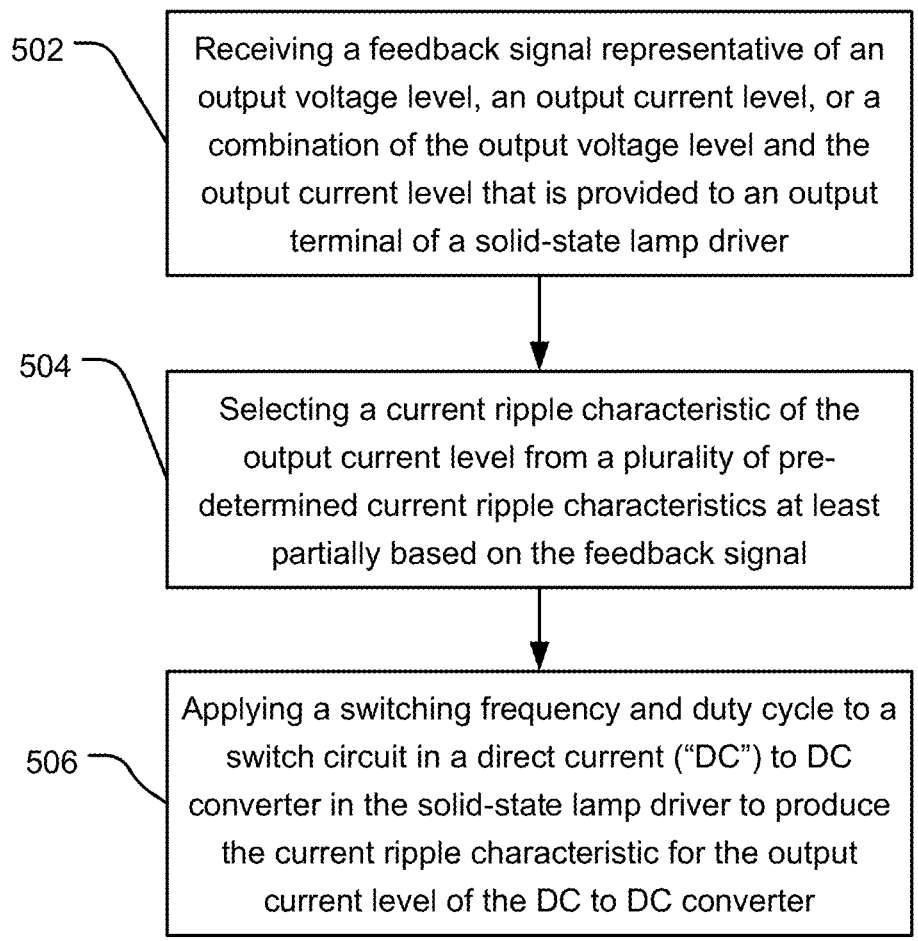
FIG. 5 is a flowchart illustrating a method according to embodiments disclosed herein.

FIG. 5 is a flow chart illustrating a method consistent with the present disclosure. The illustrated flow chart may be shown and described as including a particular sequence of steps. It is to be understood, however, that the sequence of steps merely provides an example of how the general functionality described herein can be implemented. The steps do not have to be executed in the order presented unless otherwise indicated.

FIG. 5 illustrates a method 500 of operating a solid state driver. In operation 502, a controller circuit for the solid state driver receives a feedback signal representative of an output voltage level (e.g. an average or peak output voltage level), an output current level (e.g. an average or peak output current level), or a combination of the output voltage level and the output current level that are provided to an output terminal of a solid state driver. In operation 504, a controller circuit for the solid state driver selects a current ripple characteristic of the output current level from a plurality of pre-determined current ripple characteristics at least partially based on the feedback signal. In operation 506, a controller circuit for the solid state driver applies a switching frequency and duty cycle to a switch circuit in a direct current ("DC") to DC converter in the solid state driver to produce the current ripple characteristic for an output current of the DC to DC converter.

In one embodiment, the solid state driver initially determines if the DC input is greater than 160V, prior to starting the driver with default current ripple characteristics settings.

Figure 6A:
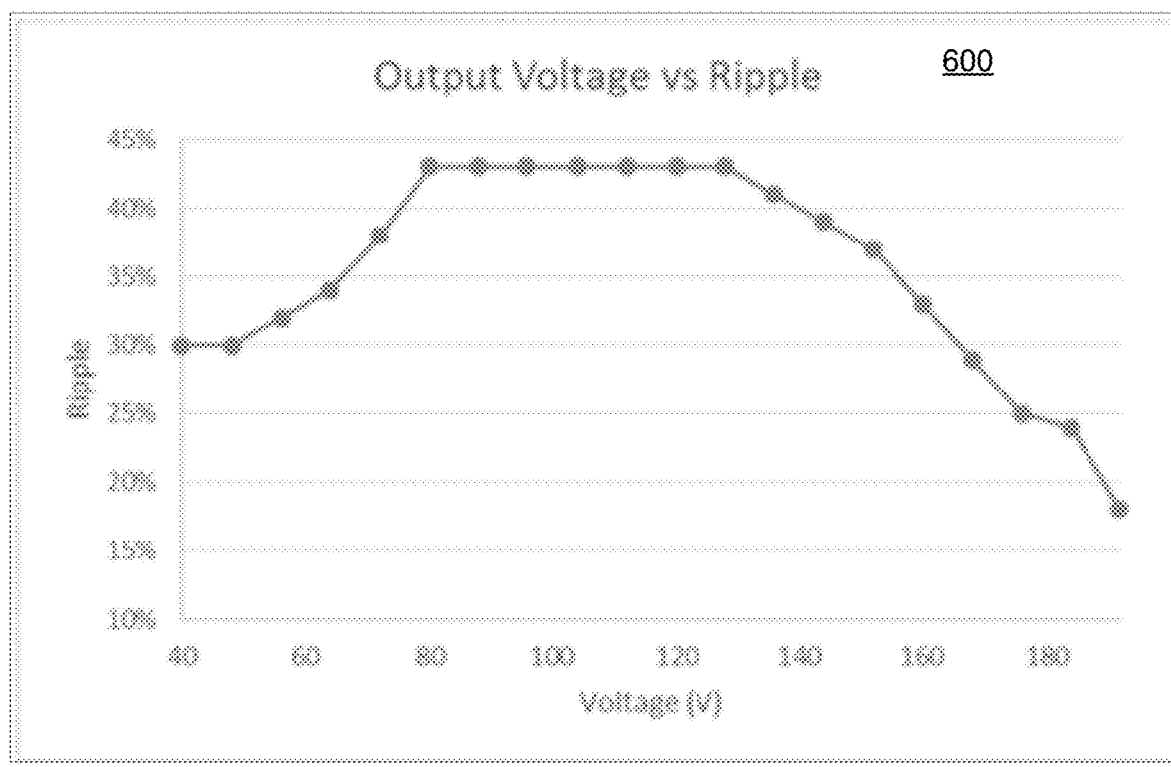
FIGS. 6A and 6B are illustrative examples of output voltage levels and output current levels graphed against current ripple percentages, according to embodiments disclosed herein.
Figure 6B:
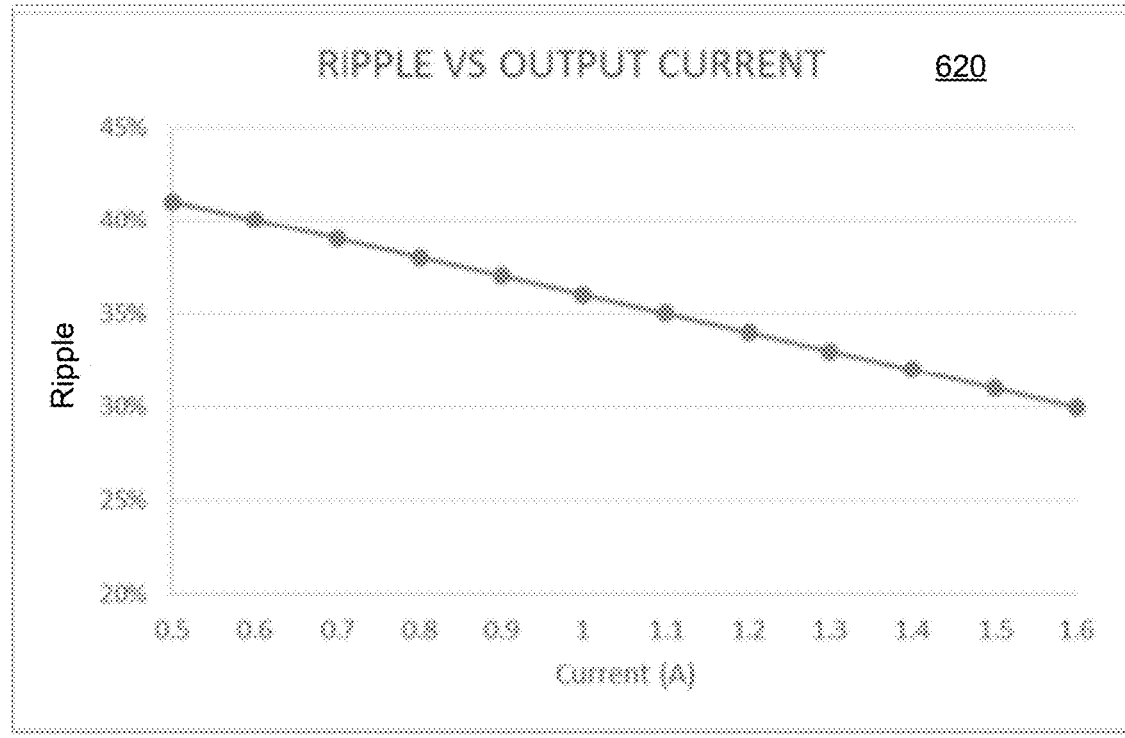

FIGS. 6A and 6B are graphs that are example illustrations of an output voltage versus ripple graph 600 and an output current versus ripple graph 620 that may be used to correspond current ripple percentages with output voltage levels, as shown in Table 1, and that may be used to correspond current people percentages with output current levels, as shown in Table 2.

Figure 7A:
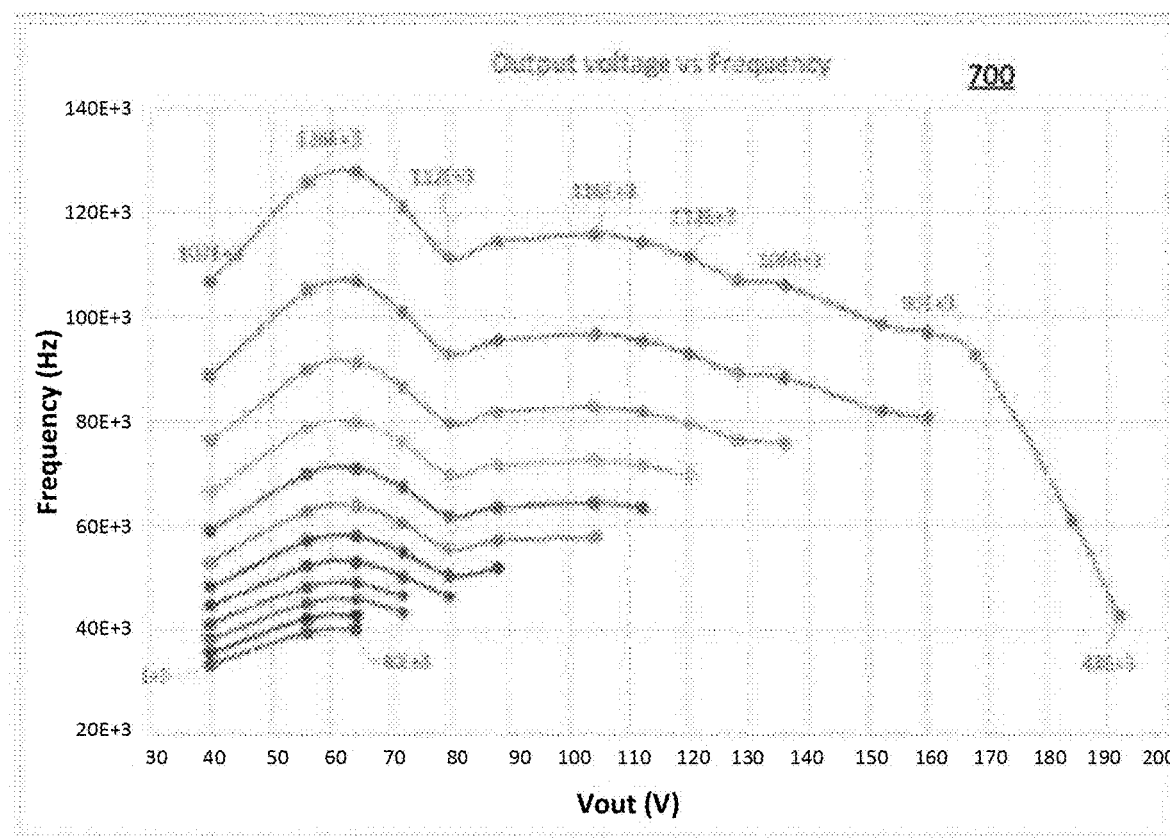
FIGS. 7A and 7B are illustrative examples of output voltage levels and output current levels graphed against current ripple operating frequencies, according to embodiments disclosed herein.
Figure 7B:
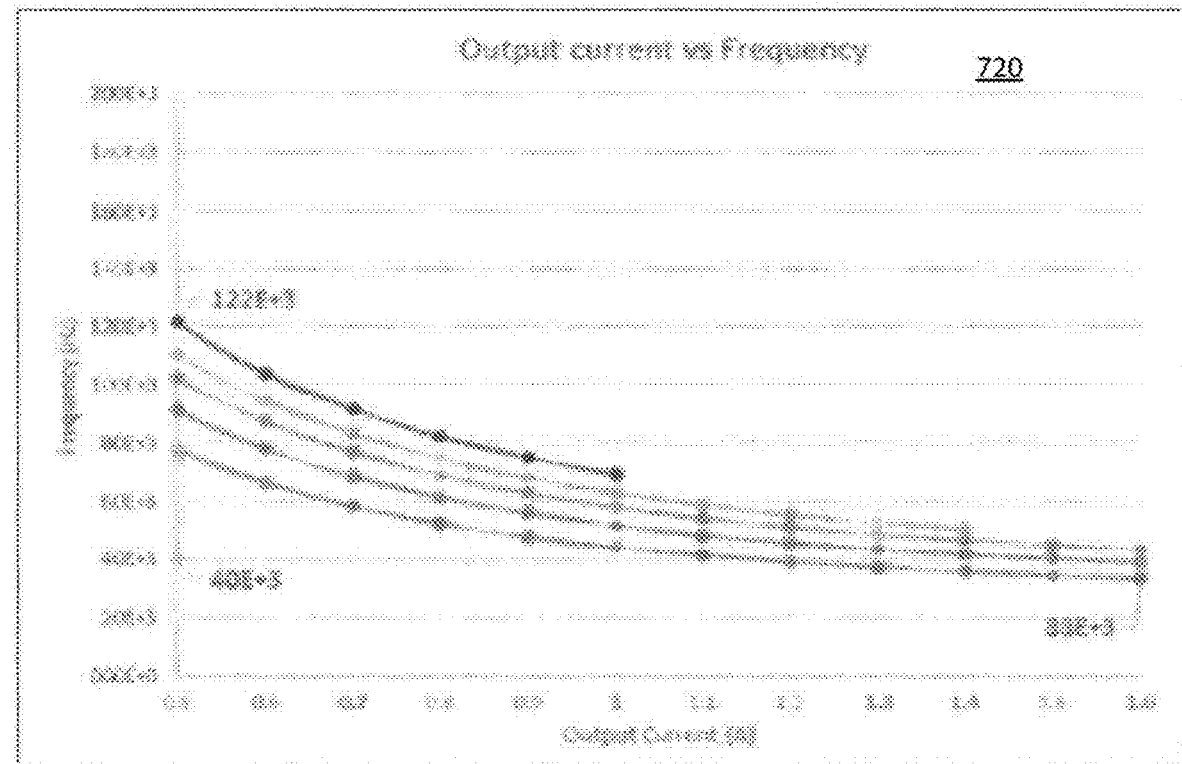

FIGS. 7A and 7B are graphs that are example illustrations of an output voltage versus frequency graph 700 and an output current versus frequency graph 720, which show that the operating frequency ranges are below 120 kHz, which is nearly half of the frequency (e.g., approximately 200 kHz) of traditional implementations of a fixed current rippled solid state driver circuit.

Figure 8A:
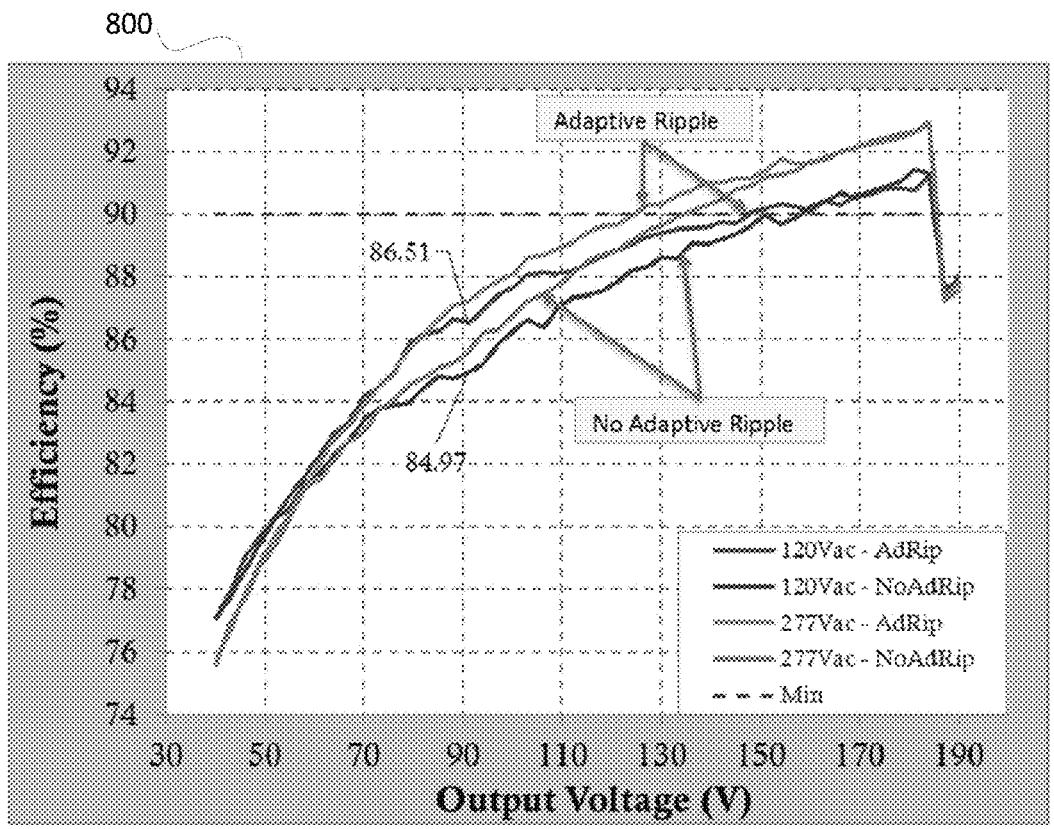
FIGS. 8A and 8B are illustrative examples of improvements in efficiency of operation of a solid state driver circuit, according to embodiments disclosed herein.
Figure 8B:
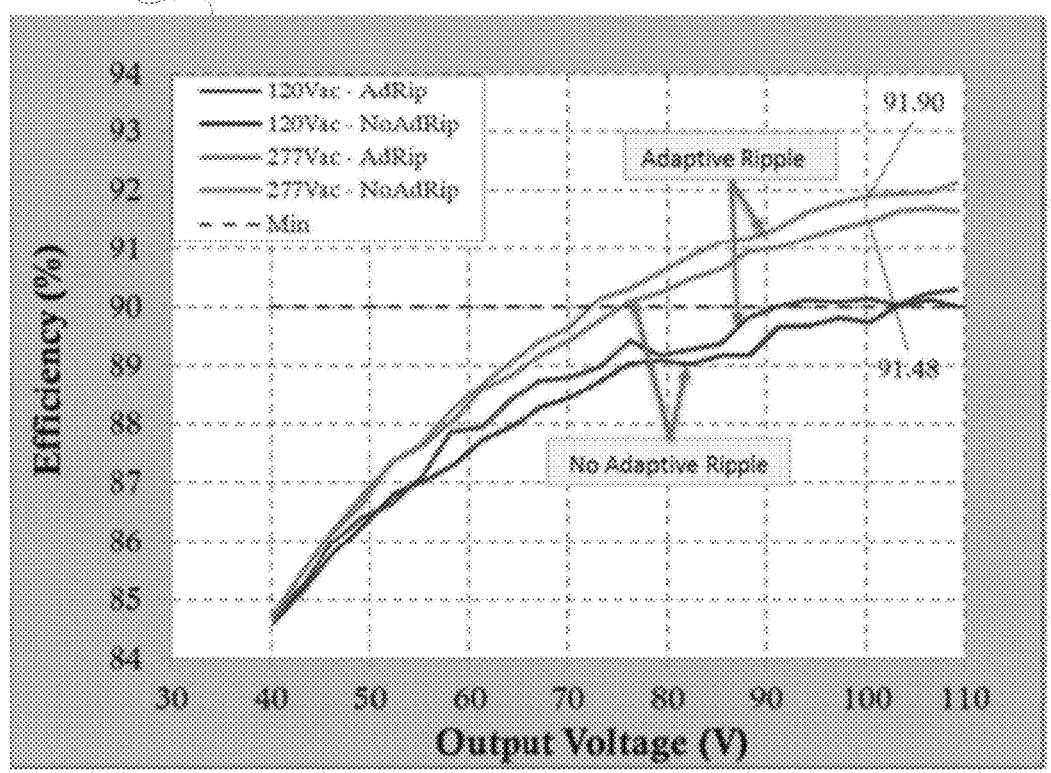

FIGS. 8A and 8B are graphs that are example illustrations of a graph 800 and a graph 820 that illustrate efficiency benefits of up to 2% in some applications of the disclosed solid state driver circuit. Although the graphs 800 and 820 illustrate up to 2% efficiency gains, higher or lower gains may be achieved, based on particular applications.

Figure 9:
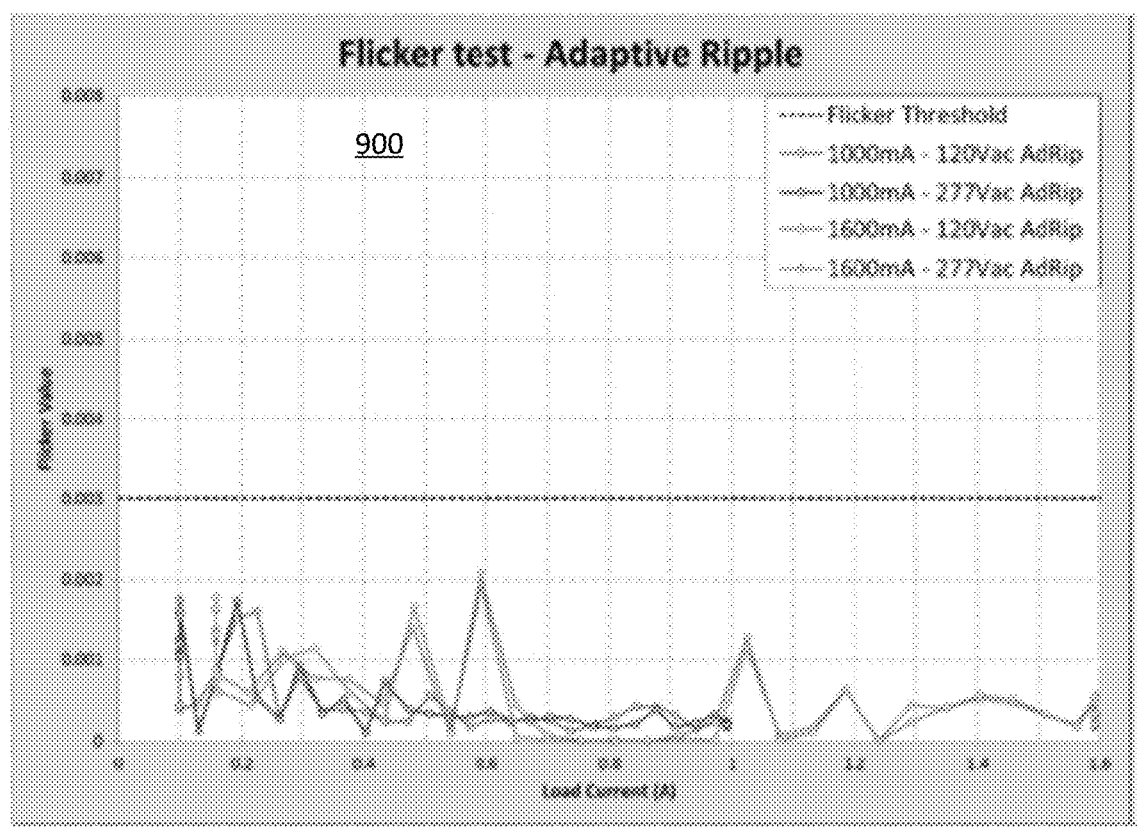
FIG. 9 is an illustrative example of an embodiment of a disclosed solid state driver circuit operating without flicker, according to embodiments disclosed herein.

FIG. 9 is a graph that is an example illustration of a flicker value graph 900 that illustrates that, by implementing the disclosed techniques, the disclosed solid state driver circuit does not cause flicker in solid state lighting devices.

The methods and systems described herein are not limited to a particular hardware or software configuration, and may find applicability in many computing or processing environments. The methods and systems may be implemented in hardware or software, or a combination of hardware and software. The methods and systems may be implemented in one or more computer programs, where a computer program may be understood to include one or more processor executable instructions. The computer program(s) may execute on one or more programmable processors, and may be stored on one or more storage medium readable by the processor (including volatile and non-volatile memory and/or storage elements), one or more input devices, and/or one or more output devices. The processor thus may access one or more input devices to obtain input data, and may access one or more output devices to communicate output data. The input and/or output devices may include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) may be implemented using one or more high level procedural or object-oriented programming languages to communicate with a computer system; however, the program(s) may be implemented in assembly or machine language, if desired. The language may be compiled or interpreted.

As provided herein, the processor(s) may thus be embedded in one or more devices that may be operated independently or together in a networked environment, where the network may include, for example, a Local Area Network (LAN), wide area network (WAN), and/or may include an intranet and/or the internet and/or another network. The network(s) may be wired or wireless or a combination thereof and may use one or more communications protocols to facilitate communications between the different processors. The processors may be configured for distributed processing and may utilize, in some embodiments, a client-server model as needed. Accordingly, the methods and systems may utilize multiple processors and/or processor devices, and the processor instructions may be divided amongst such single- or multiple-processor/devices.

The device(s) or computer systems that integrate with the processor(s) may include, for example, a personal computer(s), workstation(s) (e.g., Sun, HP), personal digital assistant(s) (PDA(s)), handheld device(s) such as cellular telephone(s) or smart cellphone(s), laptop(s), handheld computer(s), or another device(s) capable of being integrated with a processor(s) that may operate as provided herein. Accordingly, the devices provided herein are not exhaustive and are provided for illustration and not limitation.

References to "a microprocessor" and "a processor", or "the microprocessor" and "the processor," may be understood to include one or more microprocessors that may communicate in a stand-alone and/or a distributed environment(s), and may thus be configured to communicate via wired or wireless communications with other processors, where such one or more processor may be configured to operate on one or more processor-controlled devices that may be similar or different devices. Use of such "microprocessor" or "processor" terminology may thus also be understood to include a central processing unit, an arithmetic logic unit, an application-specific integrated circuit (IC), and/or a task engine, with such examples provided for illustration and not limitation.

Furthermore, references to memory, unless otherwise specified, may include one or more processor-readable and accessible memory elements and/or components that may be internal to the processor-controlled device, external to the processor-controlled device, and/or may be accessed via a wired or wireless network using a variety of communications protocols, and unless otherwise specified, may be arranged to include a combination of external and internal memory devices, where such memory may be contiguous and/or partitioned based on the application. Accordingly, references to a database may be understood to include one or more memory associations, where such references may include commercially available database products (e.g., SQL, Informix, Oracle) and also proprietary databases, and may also include other structures for associating memory such as links, queues, graphs, trees, with such structures provided for illustration and not limitation.

References to a network, unless provided otherwise, may include one or more intranets and/or the internet. References herein to microprocessor instructions or microprocessor-executable instructions, in accordance with the above, may be understood to include programmable hardware.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. A solid state driver circuit, comprising:
    an output terminal configured to drive a solid state lighting device;
    an inductor circuit coupled to the output terminal, the inductor circuit configured to supply a range of current levels to the output terminal to drive the solid state lighting device, the range of current levels having a current ripple characteristic, the inductor circuit having a first terminal and a second terminal;
a capacitor circuit coupled to the output terminal and to the first terminal of the inductor circuit, the capacitor circuit configured to at least partially maintain an output voltage level at the output terminal;
a switch circuit coupled to the second terminal of the inductor circuit, the switch circuit configured to selective couple the inductor circuit to an input terminal; and
a controller circuit coupled to the switch circuit, wherein the controller circuit is configured to set the current ripple characteristic to one of a plurality of stored pre-determined current ripple characteristics selected at least partially based on the output voltage level, an output current level, or a combination of the output voltage level and the output current level at the output terminal,
wherein the plurality of stored pre-determined current ripple characteristics corresponding to a plurality of sensed output voltages or a plurality of sensed output current ranges are stored in a data structure by the controller circuit,
wherein the range of current levels includes a current ripple maximum current level and a current ripple minimum current level, wherein the current ripple characteristic is a current ripple percentage of the current ripple maximum, and
wherein the controller circuit determines the current ripple percentage by identifying a first current ripple percentage based on the output voltage and identifying a second current ripple percentage based on output current and averaging the first and second ripple current percentages.

2. The solid state lighting device driver of claim 1, wherein the current ripple percentage is within a range from 15% through 45%.

3. The solid state lighting device driver of claim 1, wherein the controller circuit is further configured to apply a representation of the output voltage level to the data structure to determine which one of the plurality of stored pre-determined current ripple characteristics to use to set the current ripple characteristic.

4. The solid state lighting device driver of claim 1, wherein the controller circuit is further configured to apply a representation of the output current level to the data structure to determine which one of the plurality of stored pre-determined current ripple characteristics to use to set the current ripple characteristic.

5. The solid state lighting device driver of claim 1, further comprising:
a feedback circuit coupled between the controller circuit and the output terminal, wherein the feedback circuit is configured to sense the output voltage level, the output current level, or both the output voltage level and the output current level;
wherein the feedback circuit is further configured to convert the output voltage level, the output current level, or both the output voltage level and the output current level to a scaled output level and to provide the scaled output level to the controller circuit.

6. The solid state lighting device driver of claim 1, wherein when the output voltage level is between a first voltage level threshold and a second voltage level threshold, the controller circuit is further configured to set the current ripple characteristic to a constant current ripple percentage.

7. The solid state lighting device driver of claim 6, wherein the current ripple percentage is between 18%-45%.

8. The solid state lighting device driver of claim 6, wherein the first voltage level threshold is between 70 V-90 V and the second voltage level threshold is between 120 V 140 V.

9. The solid state lighting device driver of claim 1, wherein the output terminal, the inductor circuit, the capacitor circuit, and the switch circuit are coupled in a buck converter configuration.

10. The solid state lighting device driver of claim 9, wherein the inductor circuit is a single inductor, wherein the capacitor circuit is a single capacitor, and wherein the switch circuit is a single MOSFET power switch package.

11. A solid state lighting device assembly, comprising:
a solid state lighting device having a plurality of solid state light sources; and
a solid state lighting device driver coupled to the solid state lighting device to operate the solid state lighting device by providing power to the plurality of solid state light sources, the solid state lighting device driver including:
an output terminal configured to drive a solid state lighting device;
an inductor circuit coupled to the output terminal, the inductor circuit configured to supply a range of current levels to the output terminal to drive the solid state lighting device, the range of current levels having a current ripple characteristic, the inductor circuit having a first terminal and a second terminal;
a capacitor circuit coupled to the output terminal and to the first terminal of the inductor circuit, the capacitor circuit configured to at least partially maintain an output voltage level at the output terminal;
a switch circuit coupled to the second terminal of the inductor circuit, the switch circuit configured to selective couple the inductor circuit to an input terminal; and
a controller circuit coupled to the switch circuit, the controller circuit configured to set the current ripple characteristic to one of a plurality of stored pre-determined current ripple characteristics selected at least partially based on the output voltage level, an output current level, or a combination of the output voltage level and the output current level at the output terminal,
wherein the plurality of stored pre-determined current ripple characteristics corresponding to a plurality of sensed output voltages or a plurality of sensed output current ranges are stored in a data structure by the controller circuit,
wherein the range of current levels includes a current ripple maximum current level and a current ripple minimum current level, wherein the current ripple characteristic is a current ripple percentage of the current ripple maximum, and
wherein the controller circuit determines the current ripple percentage by identifying a first current ripple percentage based on the output voltage and identifying a second current ripple percentage based on output current and averaging the first and second ripple current percentages.

12. The solid state lighting device assembly of claim 11, wherein the controller circuit is further configured to apply a representation of the output voltage level to the data structure to determine which one of the plurality of stored pre-determined current ripple characteristics to use to set the current ripple characteristic.

13. The solid state lighting device assembly of claim 11, wherein the output terminal, the inductor circuit, the capacitor circuit, and the switch circuit are coupled in a buck converter configuration.

14. A method for controlling a current ripple characteristic for an output current level of a solid state driver circuit, the solid state driver circuit comprising:
- an output terminal configured to drive a solid state lighting device;
- an inductor circuit coupled to the output terminal, the inductor circuit configured to supply a range of current levels to the output terminal to drive the solid state lighting device, the range of current levels having a current ripple characteristic, the inductor circuit having a first terminal and a second terminal;
- a capacitor circuit coupled to the output terminal and to the first terminal of the inductor circuit, the capacitor circuit configured to at least partially maintain an output voltage level at the output terminal;
- a switch circuit coupled to the second terminal of the inductor circuit, the switch circuit configured to selective couple the inductor circuit to an input terminal; and
- a controller circuit coupled to the switch circuit, wherein the controller circuit is configured to set the current ripple characteristic to one of a plurality of stored pre-determined current ripple characteristics selected at least partially based on the output voltage level, an output current level, or a combination of the output voltage level and the output current level at the output terminal
- wherein the plurality of stored pre-determined current ripple characteristics corresponding to a plurality of sensed output voltages or a plurality of sensed output current ranges are stored in a data structure by the controller circuit, and wherein the range of current levels includes a current ripple maximum current level and a current ripple minimum current level, wherein the current ripple characteristic is a current ripple percentage of the current ripple maximum, and
- wherein the controller circuit determines the current ripple percentage by identifying a first current ripple percentage based on the output voltage and identifying a second current ripple percentage based on output current and averaging the first and second ripple current percentages, the method comprising:
- receiving, by the controller circuit, a feedback signal representative of an output voltage level, an output current level, or a combination of the output voltage level and the output current level that is provided to the output terminal of the solid state driver circuit;
- selecting from the data structure, by the controller circuit, a current ripple characteristic of the output current level from the plurality of stored pre-determined current ripple characteristics at least partially based on the feedback signal; and
- applying a switching frequency and duty cycle to a switch circuit in a direct current ("DC") to DC converter in the solid state lighting device driver to produce the current ripple characteristic for the output current level of the DC to DC converter.

15. The method of claim 14, wherein the current ripple characteristic is a current ripple percentage of a current ripple maximum current level of the output current level.

16. The method of claim 14, wherein the DC to DC converter is a buck converter comprising the inductor circuit, the capacitor circuit, a diode circuit, and the switch circuit.

* * * * *